US008744787B2

(12) United States Patent
Reid

(10) Patent No.: US 8,744,787 B2
(45) Date of Patent: Jun. 3, 2014

(54) DYNAMIC LOAD ESTIMATION OF MULTIPLE BRANCH CIRCUITS

(75) Inventor: Drew Reid, Brentwood, TN (US)

(73) Assignee: Schneider Electric USA, Inc., Palatine, IL (US)

( * ) Notice: Subject to any disclaimer, the term of this patent is extended or adjusted under 35 U.S.C. 154(b) by 1195 days.

(21) Appl. No.: 12/647,012

(22) Filed: Dec. 24, 2009

(65) Prior Publication Data

US 2011/0161021 A1 Jun. 30, 2011

(51) Int. Cl.
*G01R 21/00* (2006.01)

(52) U.S. Cl.
USPC .......................................................... 702/61

(58) Field of Classification Search
USPC .......................................................... 702/61
See application file for complete search history.

(56) References Cited

U.S. PATENT DOCUMENTS

| 6,430,518 | B1 | 8/2002 | Roche |
| 7,526,393 | B2 | 4/2009 | Thurmond et al. |
| 2003/0093390 | A1 | 5/2003 | Onoda et al. |
| 2004/0167732 | A1 | 8/2004 | Spitaels et al. |
| 2007/0008076 | A1 | 1/2007 | Rodgers et al. |
| 2007/0010916 | A1 | 1/2007 | Rodgers et al. |
| 2007/0150215 | A1 | 6/2007 | Spitaels et al. |
| 2008/0278344 | A1 | 11/2008 | Bardehle et al. |
| 2009/0045804 | A1 | 2/2009 | Durling et al. |
| 2009/0082980 | A1 | 3/2009 | Thurmond et al. |
| 2010/0094573 | A1* | 4/2010 | Yang et al. ...................... 702/61 |
| 2012/0316808 | A1* | 12/2012 | Frader-Thompson et al. . 702/61 |

FOREIGN PATENT DOCUMENTS

| EP | 1136829 A1 | 9/2001 |
| EP | 2012132 A1 | 1/2009 |

OTHER PUBLICATIONS

International Search Report and Written Opinion from corresponding International Application, PCT/US2010/061772, dated Apr. 20, 2011.

* cited by examiner

*Primary Examiner* — John Breene
*Assistant Examiner* — Eman Alkafawi
(74) *Attorney, Agent, or Firm* — Lando & Anastasi, LLP

(57) ABSTRACT

Systems and methods of branch circuit load estimation are disclosed. A total power usage of a main line of an electrical distribution panel that includes a plurality of branch circuits with at least two of the plurality of branch circuits coupled to the main line can be determined. A first power usage of the main line is determined with a first of the two branch circuits decoupled from the main line, and a first time period that the first branch circuits is coupled with the main line is identified. A kilowatt-hour energy usage value of the first branch circuit is estimated based on the first time period and a differential between the total power usage and the first power usage.

23 Claims, 2 Drawing Sheets

DYNAMIC LOAD ESTIMATION OF MULTIPLE BRANCH CIRCUITS

BACKGROUND OF THE INVENTION

1. Field of Invention

Embodiments of the present invention relate generally to circuit load characteristics, and more specifically, to estimating energy usage of branch circuits of an electrical distribution panel.

2. Discussion of Related Art

Electrical equipment consumes energy, and different types of electrical equipment have different energy requirements. Knowledge of the amount of energy used by different types of electrical equipment facilitates efficient power distribution and billing for consumed power and other power management operations.

Determining the energy consumption of a load generally requires direct and individual power measurements of that load. Distributed power meters individually register power consumption of different loads, even when the power to each load originates from a common power source. For example, a main power source supplies power to an apartment complex, and separate power meters register the power consumption of each apartment for billing or other purposes. This generally requires a dedicated power meter for each apartment, which is costly and inefficient, and requires redundant infrastructure elements throughout a power distribution system.

United States Patent Application Publication US 2008/0278344 to Bardehle, et al. relates to a method and arrangement for registering and evaluating energy consumption. Bardehle discloses buildings such as hotels that have a building-wide data bus as part of an energy management system. This data bus makes it possible to register the switched-on duration of individual loads such as the lighting or heating system of individual hotel rooms. The energy consumption of a particular hotel room is then determined by multiplying the registered on-time of the individual loads by the specific electrical power or energy consumption of the load. However, this requires advance knowledge of the specific electrical power of the load, such as the wattage ratings of the lighting devices in a particular hotel room, in order to evaluate energy consumption.

SUMMARY OF THE INVENTION

There is a need for the systems and methods described herein that provide individual branch circuit energy usage based on a main line power estimation and not individual branch circuit power measurements. As discussed herein, power usage of an electrical distribution panel main line is determined with a plurality of branch circuits coupled to the main line and again with one of the plurality of branch circuits decoupled from the main line. The energy usage of individual branch circuits is estimated based at least in part on the difference between the power usage of the panel with that branch circuit coupled and decoupled to the main line. These systems and methods estimate branch circuit energy usage based on main line power measurements during different panel states of operation without individual direct branch circuit power or current measurements, and without advance knowledge of branch circuit load characteristics.

In some embodiments, a main line couples a power source with a plurality of branch circuits of an electrical distribution panel. The total power usage of the main line is determined with at least two of the plurality of branch circuits coupled to the main line, and a first power usage of the main line is determined when a first of the at least two branch circuits is decoupled from the main line. A first time period that the first branch circuits is coupled from the main line is identified, and the energy usage of the first branch circuit is estimated based on the first time period and a differential between the total power usage and the first power usage.

One aspect is directed to a method of estimating energy provided to a load. The method includes an act of determining a total power usage of a main line of an electrical distribution panel. The electrical distribution panel has a plurality of branch circuits with at least two of the plurality of branch circuits coupled to the main line. The method also includes acts of determining a first power usage of the main line with a first of the two branch circuits decoupled from the main line, and identifying a first time period that the first branch circuit is coupled with the main line. A kilowatt-hour energy usage value of the first branch circuit is estimated based on the first time period and a differential between the total power usage and the first power usage.

One other aspect is directed to a branch circuit load estimation system. The system includes an electrical distribution panel with a plurality of branch circuits, and a power sensor. The power sensor determines total power usage of a main line of the electrical distribution panel during operation with at least two of the plurality of branch circuits coupled to the main line. The power sensor also determines a first power usage of the main line with a first of the two branch circuits decoupled from the main line. A controller determines a first time period that the first branch circuit is coupled with the main line, and estimates a kilowatt-hour energy usage value of the first branch circuit based on the first time period and a differential between the total power usage and the first power usage.

One other aspect is directed to a branch circuit load estimation system. The system includes an electrical distribution panel having a plurality of branch circuits and a power sensor. The power sensor determines total power usage of a main line of the electrical distribution panel during operation with at least two of the plurality of branch circuits coupled to the main line. The power sensor also determines a first power usage of the main line with a first of the two branch circuits decoupled from the main line. A controller determines a first time period that the first branch circuit is coupled with the main line. The system also includes means for estimating a kilowatt-hour energy usage value of the first branch circuit based on the first time period and a differential between the total power usage and the first power usage.

In some embodiments, a decoupling of the first branch circuit from the main line is detected, and the first power usage is determined with a second of the two branch circuits coupled with the main line. In one embodiment, a state change of the first branch circuit from an ON state to an OFF state is detected and the first power usage is determined with the first branch circuit in the OFF state. A second kilowatt-hour energy usage value of the first branch circuit can be estimated during a second time period based on the first time period and a differential between the total power usage and the first power usage. In one embodiment, the second kilowatt-hour energy usage value is averaged with a previous estimated kilowatt-hour energy usage value of the first branch circuit, wherein the previous estimated kilowatt-hour energy usage value consists of estimated kilowatt-hour energy usage value of the first branch circuit during a third time period that occurs prior to the second time period.

In one embodiment, the total power usage is determined by metering a current of the main line with the at least two of the plurality of branch circuits coupled with the main line, and calculating the total power usage based on the current and a voltage corresponding to the current. The first power usage can also be determined by metering a current of the main line with the first branch circuit decoupled from the main line and calculating the first power usage based on the current and a voltage corresponding to the current.

In some embodiments, the total power usage of the main line is determined with each of the plurality of branch circuits coupled simultaneously with the main line, and the first power usage is determined with the first branch circuit decoupled from the main line and with each of the plurality of branch circuits except for the first branch circuit coupled with the main line. In one embodiment a plurality of states of the electrical distribution panel is identified, where each state consists of one branch circuit of the plurality of branch circuits that is decoupled from the main line and one coupled branch circuit of the plurality of branch circuits that is coupled with the main line. The total power usage of the main line for at least two of the plurality of states, and, for the at least two states, a kilowatt-hour energy usage value of the one branch circuit that is decoupled from the main line during each of the at least two states is estimated.

In one embodiment, a first cycle that includes a plurality of states of the electrical distribution panel is identified, where each state consists of one branch circuit of the plurality of branch circuits that is decoupled from the main line and one coupled branch circuit of the plurality of branch circuits that is coupled with the main line. The total power usage of the main line can be determined at each of the plurality of states of the first cycle, and, for a first state of the first cycle, a kilowatt-hour energy usage value of the one branch circuit that is decoupled from the main line during the first state is estimated and averaged with a kilowatt-hour energy usage value of the one branch circuit corresponding to a state of a second cycle of a plurality of second states.

Other aspects, embodiments, and advantages of these exemplary aspects and embodiments will become apparent from the following detailed description, taken in conjunction with the accompanying drawings, illustrating the principles of the invention by way of example only. Both the foregoing information and the following detailed description include illustrative examples of various aspects and embodiments, and are intended to provide an overview or framework for understanding the nature and character of the claimed aspects and embodiments. The drawings, together with the remainder of the specification, serve to describe and explain the claimed aspects and embodiments.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
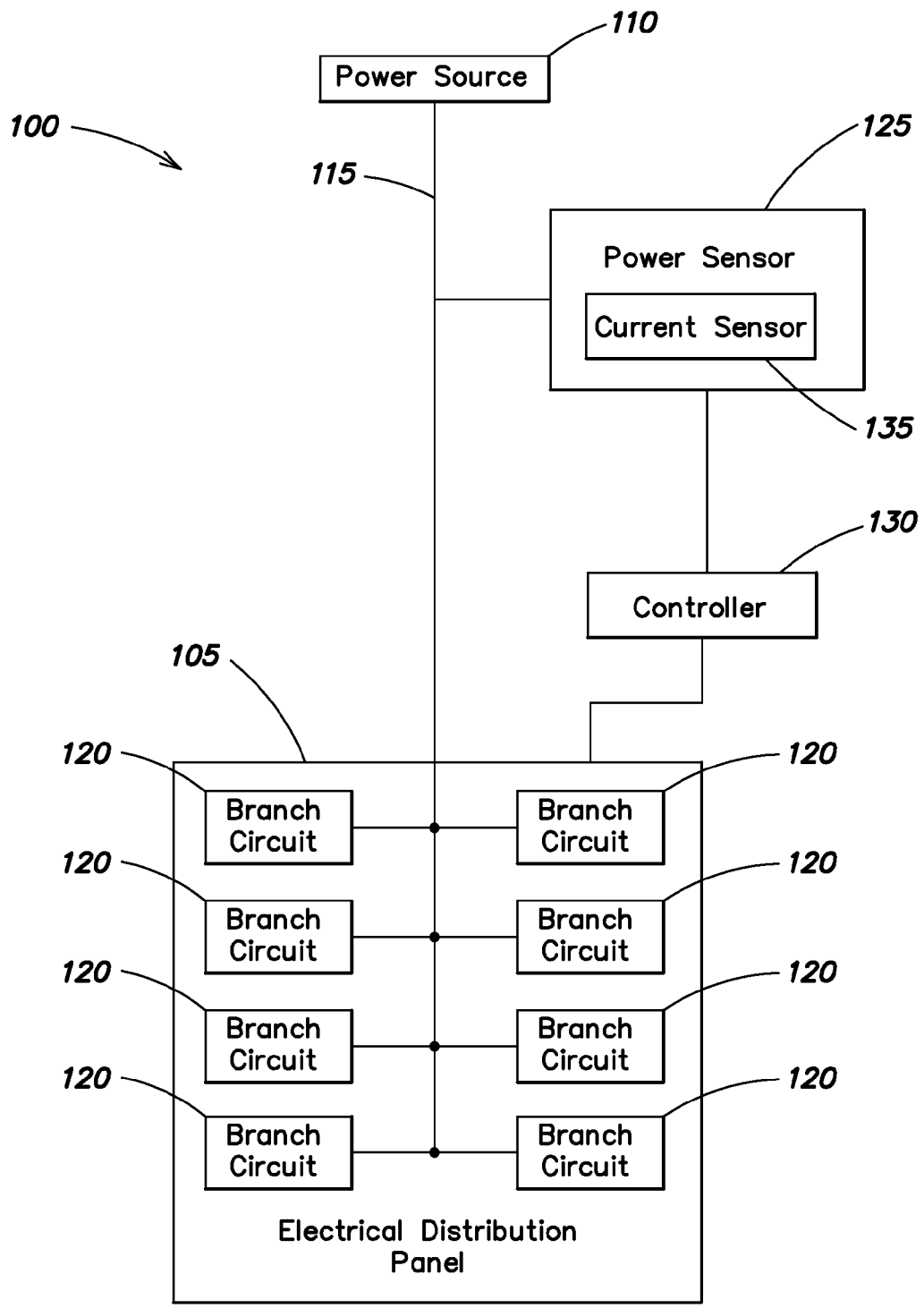
FIG. 1 is a functional block diagram depicting a load estimation system in accordance with an embodiment.

The systems and methods described herein are not limited in their application to the details of construction and the arrangement of components set forth in the description or illustrated in the drawings. The invention is capable of other embodiments and of being practiced or of being carried out in various ways. Also, the phraseology and terminology used herein is for the purpose of description and should not be regarded as limiting. The use of "including" "comprising" "having" "containing" "involving" and variations thereof herein, is meant to encompass the items listed thereafter and equivalents thereof as well as additional items.

FIG. 1 is a functional block diagram depicting an embodiment of a load estimation system 100 that includes an electrical distribution panel 105, a power source 110, a main line 115, branch circuits 120, a power sensor 125, a controller 130, and a current sensor 135. The main line 115 couples the electrical distribution panel 105 with the power source 110 and branches within the electrical distribution panel 105 into a plurality of power lines for each of the plurality of branch circuits 120 that are included in the electrical distribution panel 105.

The electrical distribution panel 105 may include any distribution board, panel board, or circuit breaker panel that divides an electrical power feed into the plurality of branch circuits 120. The electrical distribution panel 105 may also include one or more circuit breakers or fuses, and in one embodiment is enclosed in a protective casing having a removable panel or door that grants access to the branch circuits 120 and/or their associated circuit breakers. In one embodiment, the circuit breakers are remotely operated circuit breakers that provide overcurrent protection and have an integral operator that selectively and reversibly turns the circuit breakers on and off. For example, circuit breakers described herein include the Powerlink® series of remotely operated circuit breakers provided by the Schneider Electric USA Inc.

During operation, the electrical distribution panel 105 cycles through a plurality of different states. For example, in one state each branch circuit 120 is coupled with the main line 115. In another state one branch circuit is decoupled with the main line 115 with every other branch circuit coupled. In one embodiment, these iterations continue until the cycle is complete. In another state a first plurality of branch circuits are coupled and a second plurality of branch circuits are decoupled. It is appreciated that any combination of zero or more branch circuits 120 may be coupled or decoupled from the main line 115 during a time period based on the state of the corresponding circuit breaker and its associated controller. The controller 130 controls switching operations to reversibly couple branch circuits 120 with the main line 115, or determines that a switching operation has occurred without having controlled or instructed that switching operation.

The branch circuits 120 supply power to any type of load, such as lighting loads that are constant or variable, known or unknown. For example, when branch circuit loads are substantially constant but unknown, the current sensor 135 determines the total current of the electrical distribution panel 105 based on measurements at the main line 115. This total current is proportioned to each branch circuit 120 load based, for example, on the change in total electrical distribution panel 105 load resulting from the coupling and decoupling of branch circuits 120 with the main line 115.

The power sensor 125, which may be referred to as a meter, measures the overall power draw of the electrical distribution panel 105 at the main line 115 without requiring individual branch circuit 120 power measurements, and determines this power draw when the electrical distribution panel 105 is in various states, i.e., when some branch circuits 120 are active and others are inactive. In one embodiment, total power usage of the main line 115 at a period of time is the sum of the power usage of each branch circuit 120 coupled to the main line 115 at that period of time. The controller 130 evaluates this power draw information to estimate branch circuit loads of the branch circuits 120.

In one embodiment, power sensor 125 includes a current sensor 135. The current sensor 135 meters current of main line 115 when any number of branch circuits 120 are coupled or decoupled with the main line 115. In one embodiment where power source 110 includes a three phase power source, current sensor 135 includes a current transformer for each phase to measure current before and/or after the branch circuits 120 switch states. The controller 130 and the current sensor 135 determine changes in current that result from this load switching. The controller 130 or the power sensor 125 calculates power usage of the electrical distribution panel 105 at a particular switching state based on the metered current and a corresponding voltage.

The controller 130 determines the time period that one of the branch circuits 120 is coupled to the main line 115. The controller 130 also tracks the status of the branch circuits 120 to determine if they are coupled (e.g., active or drawing power) with the main line 115 or decoupled (e.g., inactive or not drawing power) from the main line 115 during any time period. This information is combined with information from the power sensor 125 to determine total power usage of the electrical distribution panel 105 and to estimate the energy usage of the branch circuit 120. In an illustrative embodiment, the power sensor 125 determines the total power drawn by the electrical distribution panel 105 during a time period when at least two of the branch circuits 120 are coupled to the main line 115. Subsequent to the decoupling of one of the two branch circuits 120, the power sensor 125 determines power drawn by the electrical distribution panel 105 with one of the two branch circuits 120 decoupled and the other of the two branch circuits 120 coupled to the main line 115. In this example, this difference in electrical distribution panel 105 power is attributed to the power draw of the decoupled branch circuit 120.

In some embodiments, the controller 130 includes a processor, logic circuit, application specific integrated circuit, any associated software, memory, firmware, hardware, and combinations thereof. The controller 130 can also include different logic devices located in different areas, such as a processor or other logic device located within electrical distribution panel 105 in combination with one or more other logic devices remote to electrical distribution panel 105. Controller 130 can include control devices provided in the Powerlink® series of circuit breakers provided by the Schneider Electric USA Inc. In one embodiment, power sensor 125 and controller 130 are part of the same device.

In operation of the system 100, based at least in part on information from the power sensor 125, the controller 130 estimates power for individual branch circuits 120. For example, the controller 130 tracks the accumulated ON time for individual branch circuits 120. The number of hours (H) accumulated for each branch circuit 120 in a time period, e.g., month, is multiplied by the power (KW) of each load to estimate the kilowatt-hours (KWH) of a branch circuit 120 load. The branch circuit 120 switching between coupled and decoupled states affects overall electrical distribution panel 105 energy usage because decoupled branch circuits 120 draw little or no power. By coordinating overall electrical distribution panel 105 power with load switching as the branch circuits 120 couple and decouple with electrical distribution panel 105, the controller 130 estimates power consumption of an individual branch circuit 120.

In one embodiment, power sensor 125 determines main line 115 power as loads of electrical distribution panel sequence from ON to OFF, e.g., when a branch circuit 120 changes from a coupled state to a decoupled state, or is disconnected from the main line 115. The change, e.g., drop, in power or current is in this example attributable to the branch circuit 120 that has sequenced off. Continuing with this illustrative embodiment, to estimate power of individual branch circuits 120, i.e., power representing the load demand of branch circuit 120, the power sensor 125 determines electrical distribution panel 105 power usage before and after one branch circuit 120 changes state, as represented by equation (1) below, where KWT is the total power demand of electrical distribution panel 105, $KW_X$ is the power demand of one branch circuit 120, and $C_x$ is the state of each branch circuit 120, e.g., open/closed or decoupled/coupled with $C_x$ having a value of 1 for the closed or coupled state and 0 for the open or decoupled state.

$$KWT = KW_1(C_1) + KW_2(C_2) + KW_3(C_3) + \ldots = KW_N(C_N) \quad (1)$$

Equations (2)-(5) below illustrate branch circuit 120 power estimation when the branch circuit 120 couples or decouples from the main line 115, where the total power demand is the sum of individual power demands of branch circuits 120. Equation (2) illustrates an example at a first sample time where all branch circuits 120 are coupled (i.e., ON or in state=1 at time C=1) with the main line 115.

$$KWT_{T1} = KW_1(1) + KW_2(1) + KW_3(1) + \ldots = KW_N(1) \quad (2)$$

In equation (3) below, at a second sample time all branch circuits 120 are coupled (i.e., ON with state=1) except branch circuit #1, which is decoupled (i.e., OFF with state=0) at time 2 (i.e., C=2).

$$KWT_{T2} = KW_1(0) + KW_2(1) + KW_3(1) + \ldots = KW_N(1) \quad (3)$$

Continuing with this example, the controller 130 determines the power demand of branch circuit #1, which switches between a coupled state (equation 2) and a decoupled state (equation 3) as the difference between equations (2) and (3), in accordance with equations (4) and (5) below:

$$KWT_{T1} - KWT_{T2} = [KW_1(1) + KW_2(1) + KW_3(1) + \ldots KW_N(1)] - [KW_1(0) + KW_2(1) + KW_3(1) + \ldots KW_N(1)] \quad (4)$$

$$KWT_{T1} - KWT_{T2} = KW_1 = \text{kilowatt demand of the first branch circuit 120.} \quad (5)$$

This power demand of a branch circuit may be influenced by voltage variations of the main line 115. In this example, power demand of the branch circuits 120 is estimated as a ratio of the branch circuit 120 power demand to the total electrical distribution panel 105 power demand during a time period. Continuing with this example, total demand at the second sample time illustrated in equation 3 is divided by the total demand at the first sample time of equation 2 to determine a ratio of the effect that the power demand branch circuit #1 had on the total power of the electrical distribution panel 105. This ratio is used to estimate the branch circuit #1 power demand at any time based on the instantaneous total demand, as illustrated in equation (6) below, where $X_1$ represents a ratio of the branch circuit #1 power demand to total electrical distribution panel 105 power demand.

$$X_1 = KW_1 / KW_{T1} \quad (6)$$

The operations in equations (1) to (6) can be performed for any branch circuit 120 of the electrical distribution panel 105 and in one embodiment, the operations are performed for each branch circuit 120 to create a set of power demand estimates for each branch circuit 120, as well as ratios of individual branch circuit 120 power demand to total electrical distribution panel 105 power demand, as illustrated in equations (7) and (8).

$$KWT = KW_1 + KW_2 + KW_3 + \ldots KW_N \tag{7}$$

$$100\% = X_1 + X_2 + X_3 + \ldots X_N \tag{8}$$

It is appreciated that equations (7) and (8) illustrate an embodiment where the branch circuits 120 can be switched off, e.g. decoupled to obtain individual ratios. If, for example, some branch circuits 120 are not switched off, then the sum of the estimated branch circuit 120 power demands may not equal the total electrical distribution panel 105 power demand, and the sum of the individual branch circuit 120 ratios may not equal 100%, as illustrated in equations (9) to (13), where $KW_U$ represents an unswitched power demand, $X_S$ is the sum of the switched ratios, and $X_U$ is the unswitched ratio, where the unswitched power demand may be recorded for use in calculations performed by the controller 130.

$$KWT = KW_1 + KW_2 + KW_3 + \ldots KW_N + KW_U \tag{9}$$

$$KW_U = KWT - (KW_1 + KW_2 + KW_3 + \ldots KW_N) \tag{10}$$

$$100\% = X_S + X_U \tag{11}$$

$$100\% = (X_1 + X_2 + X_3 + \ldots X_N) + X_U \tag{12}$$

$$X_U = 100\% - (X_1 + X_2 + X_3 + \ldots X_N) \tag{13}$$

Although the branch circuit 120 power demand of equations (1) to (13) represents branch circuit load, the ratio $X_N$ is used to estimate the branch circuit 120 power demand of a branch circuit N at any time based at least in part on the total electrical distribution panel 105 power demand, e.g., the instantaneous electrical distribution panel 105 power demand. For example, to estimate demand for branch circuit #1 where the instantaneous electrical distribution panel 105 power demand is KWT, the ratio of individual branch circuit #1 demand to total electrical distribution panel 105 power demand is $X_1 = KW_1/KW_T$, the estimated demand for the first branch circuit 120 ($KWE_1$) is represented by equation (14).

$$KWE_1 = KWT * X_1 \tag{14}$$

The estimated power demand of equation 14 does not require a manually initiated learning sequence, so that the power sensor 125 uses a single sampled main line 115 power usage value as a beginning seed value to determine the energy usage of the branch circuit 120. Consider that a single change in current/power can be manually initiated and a corresponding sample can be captured to "learn" the circuit's demand. This sample can be used as a representative value from that time forward. But calculations based on a single sample can be problematic, especially when accumulated over time. Thus, in the most basic method described there may be some inaccuracy that can be reduced by averaging multiple samples. While obtaining multiple samples can be tedious if the trigger and capture process is manually initiated, if the method to control a branch circuit ON and OFF is automatic, such as with PowerLink® breaker system, then the means exists to automate the capture of multiple samples. Thus one may use the very first sample as a seed value for what will become a "smoothed" or "moving" average by using subsequent samples to be combined with the first sample for improving accuracy as time goes on. This technique also has an advantage in that it would account for changing load characteristics.

In one embodiment, varying branch circuit loads skew estimated demand for a branch circuit 120 (e.g., $KWE_1$) because the variances affect the total electrical distribution panel 105 power demand. For example, the power sensor 125 samples the main line 115 power (e.g., total electrical distribution panel 105 input power) each time the branch circuit 120 changes state to couple or decouple with the main line 115, and load variances that occur over time become averaged into a power demand estimate or ratio of branch circuit 120 power demand to total electrical distribution panel 105 power demand.

In one embodiment, energy of the branch circuit 120 is estimated for a first time period where energy includes estimated branch circuit 120 power demand multiplied by the time in which that branch circuit 120 is ON, as illustrated in equation (15) where $H_{1T1}$ is the accumulated ON time of a first branch circuit 120 at a first point in time.

$$KWH_{T1} = KW_1 * H_{1T1} \tag{15}$$

Energy of the same or a different branch circuit 120 is also estimated for a second time period with respect to the first time period of equation (15). For example, accumulated branch circuit 120 energy is illustrated in equation (16) where $H_1T_2$ is the accumulated ON time of the first branch circuit 120 at a second point in time.

$$KWH_{T2} = KW_1 * H_{1T2} \tag{16}$$

In this example, first branch circuit 120 energy for the time period between the first and second points in time, $KWH_1$ is the difference between equations (16) and (15), as illustrated in equation (17).

$$KWH_1 = KWH_{T2} - KWH_{T1} = (KW_1 * H_{1T2}) - (KW_1 * H_{1T1})$$
$$\text{or } KW_1(H_{1T2} - H_{1T1}) \tag{17}$$

In one embodiment, the power sensor 125 determines power of electrical distribution panel 105 responsive to detection by the controller 130 of the branch circuit 120 state change from OFF to ON, (e.g., open circuit to closed circuit; or decoupled to coupled) or from ON to OFF. In both configurations the controller 130 uses the resulting estimated branch circuit 120 power demand to estimate the energy use of the branch circuit 120, as illustrated in equations (15) to (17). It is appreciated that this estimate, as well as other controller 130, power sensor 125, and current sensor 135 information are stored as needed in one or more associated electronic memory units.

In one embodiment, the controller 130 estimates power factor for the branch circuit 120. As discussed above, the current sensor 135 meters current, and the power usage is determined based on the corresponding voltage. In this illustrative embodiment, power factor is estimated using equations (18) to (23), where equation (18) determines a change in real power allocated to a first branch circuit 120, equation (19) determines a change in current allocated to the first branch circuit 120, and equation (20) determines voltage identified before the first branch circuit 120 opens.

$$KW_1 = KW_{T2} - KW_{T1} \tag{18}$$

$$I_1 = I_{T2} - I_{T1} \tag{19}$$

$$V_1 = V_{T1} \tag{20}$$

Power factor (PF) of the first branch circuit $PF_1$ is determined using equations (21) to (23).

$$PF = P(\text{Real Power})/S(\text{Apparent Power}) \tag{21}$$

$$PF_1 = (KW_{T2} - KW_{T1})/((I_{T2} - I_{T1})(V_{T1})) \tag{22}$$

$$PF_1 = KW_1/(I_1 * V_{T1}) \tag{23}$$

In one embodiment, the controller 130 estimates energy usage of branch circuits 120 by periodically capturing data sets containing total power usage of electrical distribution panel 105 for a plurality of states, where identified branch circuits 120 are closed (e.g., coupled) in each state. In this embodiment matrix algebra operations determine individual branch circuit 120 energy usage.

In one embodiment, branch circuit load estimation includes systems and methods for virtual branch load management as described in U.S. Pat. No. 7,526,393, entitled Virtual Branch Load Management, filed on Sep. 25, 2007, which is assigned to the assignee of the present invention and incorporated herein by reference in its entirety.

Figure 2:
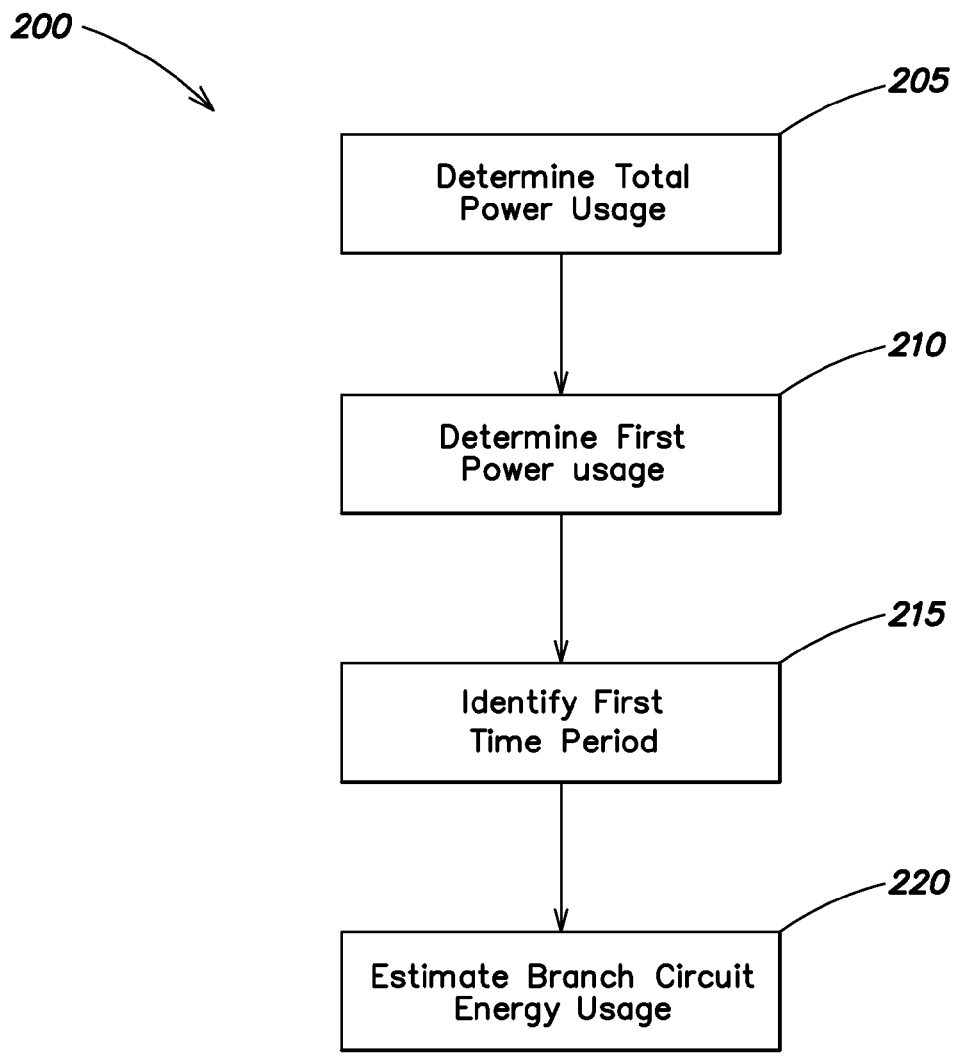
FIG. 2 is a flow chart depicting a method of estimating a load in accordance with an embodiment.

FIG. 2 is a flow chart depicting a method 200 of estimating power draw of a load in accordance with an embodiment. In one embodiment, method 200 includes acts of determining total power usage of an electrical distribution panel having a plurality of branch circuits (ACT 205), determining a first power usage of the electrical distribution panel with a first branch circuit decoupled from the main line (ACT 210), identifying a time period that the first branch circuit is coupled to the main line (ACT 215), and estimating energy usage of the first branch circuit (ACT 220).

ACT 205 determines total power usage of the electrical distribution panel based on characteristics of the main line that provides power to the branch circuits, with one of the branch circuits coupled to the main line. For example, a power or current sensor meters the main line to determine the total power usage (ACT 205). By determining total power usage (ACT 205) at the main line, it is not necessary to determine power usage at the branch circuit level. In one embodiment, determining total power usage (ACT 205) includes a current sensor to identify main line current and calculating the total power usage based on the main line current and a corresponding voltage. In one embodiment, total power usage is determined (ACT 205) with a plurality of branch circuits simultaneously coupled to the main line. Total electrical distribution panel power usage is determined (ACT 205) during any state of the electrical distribution panel, e.g., with any combination of branch circuits being coupled and decoupled to the main line of the electrical distribution panel. In one embodiment, the electrical distribution panel cycles through a plurality of different states with the total power usage of the electrical distribution panel determined (ACT 205) for a state of the cycle based at least in part on main line current or power characteristics.

A first power usage value is determined (ACT 210) based on main line characteristics with one of the plurality of branch circuits decoupled from the main line. For example, a power sensor senses main line power when all but one of the branch circuits are coupled with the main line, with one branch circuit decoupled, or a current sensor meters the main line current and determines this power usage value (ACT 210) based on the metered current and a corresponding voltage.

In one embodiment, the first power usage value is determined (ACT 210) subsequent to a detected decoupling of a branch circuit that occurs when, for example, the controller detects a state change of the branch circuit from an ON state to an OFF state. The controller may, but need not directly control this state change. For example, a remotely operated circuit breaker with a dedicated integral controller can be controlled to turn the circuit breaker on or off to change the state of the branch circuit. The determined first power usage (ACT 210) is less than the determined total power usage (ACT 205) due to power attributable to the decoupled branch circuit, where the decoupling is detected when a circuit breaker or other type of switch interrupts the electrical connection between the branch circuit and the electrical distribution panel. In one embodiment, the detected decoupling marks the end of the time period that an identified branch circuit is coupled with the main line, identified in ACT 215.

Method 200 also estimates branch circuit energy usage (ACT 220) for any branch circuit of the electrical distribution panel for any time period, as indicated in equations (1-23) above. In one embodiment, branch circuit energy is estimated (ACT 220) for a time period based on the identified first time period that a branch circuit is decoupled from the main line (ACT 215), and the differential between the determined total power usage (ACT 205) and the determined first power usage (ACT 210). For example, total power usage is determined (ACT 205). Subsequently, one of the branch circuits is decoupled from the main line, and a first power usage that is less than the total power usage is determined (ACT 210). Energy usage of the first branch circuit is estimated (ACT 220) based on the time the branch circuit is coupled with the main line and the determined power usage attributable to that branch circuit.

In one embodiment, estimated branch circuit energy (ACT 220) values are averaged with other estimated energy values determined for the same branch circuit at a different time period. For example, the estimated branch circuit energy usage (ACT 220) for one day is averaged with estimated energy usage values of the same branch circuit for previous days to estimate energy usage of that branch circuit for any time period, such as a week or month. In one embodiment, these averages are weighted to account, for example, for differences between the lengths of the time periods.

Note that in FIGS. 1 and 2, the enumerated items are shown as individual elements. In actual implementations of the systems and methods described herein, however, at least some of these items may be inseparable components of other electronic devices such as a digital computer. Thus, actions described above may be implemented at least in part in software that may be embodied in an article of manufacture that includes a program storage medium. The program storage medium includes data signals embodied in one or more of a carrier wave, a computer disk (magnetic, or optical (e.g., CD or DVD, or both)), non-volatile memory, tape, a system memory, and a computer hard drive.

From the foregoing, it will be appreciated that the systems and methods described herein afford a simple and effective way to estimate branch circuit energy usage based on main line or power source power determinations, where the main line provides power from the power source to a plurality of branch circuits. The systems and methods according to various embodiments are able to estimate branch circuit energy usage without direct branch circuit level power readings. This increases efficiency and compatibility, and lowers cost by, for example, eliminating individual branch circuit power sensors.

Any references to front and back, left and right, top and bottom, or upper and lower and the like are intended for convenience of description, not to limit the present systems and methods or their components to any one positional or spatial orientation.

Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements to single or plural configurations. For example, references to "one" element or act includes at least one element or instance of the act unless explicitly indicated to the contrary by referring to "only one" or "exactly one" element or act.

Any embodiment disclosed herein may be combined with any other embodiment, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. Such terms as used herein are not necessarily all referring to the same embodiment. Any embodiment may be combined with any other embodiment in any manner consistent with the aspects and embodiments disclosed herein.

References to "or" may be construed as inclusive so that any terms described using "or" may indicate any of a single, more than one, and all of the described terms.

Where technical features in the drawings, detailed description or any claim are followed by references signs, the reference signs have been included for the sole purpose of increasing the intelligibility of the drawings, detailed description, and claims. Accordingly, neither the reference signs nor their absence have any limiting effect on the scope of any claim elements.

One skilled in the art will realize the systems and methods described herein may be embodied in other specific forms without departing from the spirit or essential characteristics thereof. For example, a main line can provide power to more than one electrical distribution panel, where each panel includes a plurality of branch circuits. Further, individual circuit characteristics can be estimated without direct measurement of individual circuit current and different branch circuits can have different characteristics. The foregoing embodiments are therefore to be considered in all respects illustrative rather than limiting of the described systems and methods. Scope of the systems and methods described herein is thus indicated by the appended claims, rather than the foregoing description, and all changes that come within the meaning and range of equivalency of the claims are therefore intended to be embraced therein.

What is claimed is:

1. A method of estimating energy provided to a load, comprising:
   measuring, with a power sensor, a total power usage of a main line of an electrical distribution panel having a plurality of branch circuits with at least two of the plurality of branch circuits coupled to the main line;
   measuring, with the power sensor, a first power usage of the main line with a first branch circuit of the two branch circuits decoupled from the main line;
   identifying, with a controller, a first time period that the first branch circuit is coupled with the main line; and
   estimating, with the controller, a kilowatt-hour energy usage value of the first branch circuit based on the first time period and a differential between the measured total power usage and the measured first power usage.

2. The method of claim 1, comprising:
   detecting a decoupling of the first branch circuit from the main line.

3. The method of claim 1, comprising:
   measuring the first power usage with a second branch circuit of the two branch circuits coupled with the main line.

4. The method of claim 1, comprising:
   detecting a state change of the first branch circuit from an ON state to an OFF state; and
   measuring the first power usage with the first branch circuit in the OFF state.

5. The method of claim 1, comprising:
   estimating a second kilowatt-hour energy usage value of the first branch circuit during a second time period based on the first time period and a differential between the measured total power usage and the measured first power usage; and
   averaging the second kilowatt-hour energy usage value with a previous estimated kilowatt-hour energy usage value of the first branch circuit, wherein the previous estimated kilowatt-hour energy usage value consists of estimated kilowatt-hour energy usage value of the first branch circuit during a third time period that occurs prior to the second time period.

6. The method of claim 1, wherein the second time period and the first time period are of a same time length.

7. The method of claim 1, wherein measuring the total power usage comprises:
   metering a current of the main line with the at least two of the plurality of branch circuits coupled with the main line; and
   calculating the total power usage based on the current and a voltage corresponding to the current.

8. The method of claim 1, wherein measuring the first power usage comprises:
   metering a current of the main line with the first branch circuit decoupled from the main line; and
   calculating the first power usage based on the current and a voltage corresponding to the current.

9. The method of claim 1, comprising:
   measuring the total power usage of the main line with each of the plurality of branch circuits coupled simultaneously with the main line; and
   measuring the first power usage with the first branch circuit decoupled from the main line and with each of the plurality of branch circuits except for the first branch circuit coupled with the main line.

10. The method of claim 1, comprising:
    identifying a plurality of states of the electrical distribution panel, wherein each state consists of one branch circuit of the plurality of branch circuits that is decoupled from the main line and one coupled branch circuit of the plurality of branch circuits that is coupled with the main line; and
    measuring the total power usage of the main line for at least two of the plurality of states; and
    estimating, for the at least two states, a kilowatt-hour energy usage value of the one branch circuit that is decoupled from the main line during each of the at least two states.

11. The method of claim 1, comprising:
    identifying a first cycle that includes a plurality of states of the electrical distribution panel, wherein each state consists of one branch circuit of the plurality of branch circuits that is decoupled from the main line and one coupled branch circuit of the plurality of branch circuits that is coupled with the main line; and
    measuring the total power usage of the main line at each of the plurality of states of the first cycle;
    estimating, for a first state of the first cycle, a kilowatt-hour energy usage value of the one branch circuit that is decoupled from the main line during the first state; and
    averaging the kilowatt-hour energy usage value of the one branch circuit that is decoupled from the main line during the first state with a kilowatt-hour energy usage value of the one branch circuit corresponding to a state of a second cycle of a plurality of second states.

12. A branch circuit load estimation system, comprising:
an electrical distribution panel having a plurality of branch circuits;
a power sensor configured to measure a total power usage of a main line of the electrical distribution panel during operation with at least two of the plurality of branch circuits coupled to the main line;
the power sensor further configured to measure a first power usage of the main line with a first of the two branch circuits decoupled from the main line;
a controller configured to determine a first time period that the first branch circuit is coupled with the main line; and
the controller further configured to estimate a kilowatt-hour energy usage value of the first branch circuit based on the first time period and a differential between the measured total power usage and the measured first power usage.

13. The system of claim 12, wherein the controller is configured to detect a decoupling of the first branch circuit from the main line.

14. The system of claim 12, wherein the power sensor is configured to measure the first power usage with a second branch circuit of the two branch circuits coupled with the main line.

15. The system of claim 12, comprising:
the controller configured to:
detect a state change of the first branch circuit from an ON state to an OFF state; and
the power sensor configured to measure the first power usage with the first branch circuit in the OFF state.

16. The system of claim 12, comprising:
the controller configured to:
estimate a kilowatt-hour energy usage value of the first branch circuit during a second time period based on the first time period and a differential between the measured total power usage and the measured first power usage; and to
average the kilowatt-hour energy usage value of the first branch circuit with a previous estimated kilowatt hour energy usage value of the first branch circuit that consists of an estimated kilowatt-hour energy usage value of the first branch circuit during a third time period that occurs prior to the second time period.

17. The system of claim 12, wherein the second time period is greater than the first time period.

18. The system of claim 12, wherein the power sensor comprises:
a current sensor configured to meter a current of the main line with at least two of the plurality of branch circuits coupled with the main line; and
wherein the controller is configured to calculate the total power usage based on the current and a voltage corresponding to the current.

19. The system of claim 12, wherein the power sensor comprises:
a current sensor configured to meter a current of the main line with the first branch circuit decoupled from the main line; and
wherein the controller is configured to calculate the first power usage based on the current and a voltage corresponding to the current.

20. The system of claim 12, comprising:
the power sensor configured to:
measure the total power usage of the main line with each of the plurality of branch circuits coupled simultaneously with the main line; and to
measure the first power usage with the first branch circuit decoupled from the main line and with each of the plurality of branch circuits except for the first branch circuit coupled with the main line.

21. The system of claim 12, comprising:
the controller configured to identify a plurality of states of the electrical distribution panel, wherein each state comprises one branch circuit that is decoupled from the main line and one coupled branch circuit that is coupled with the main line;
the power sensor configured to measure the total power usage of the main line for at least two of the plurality of states; and
the controller configured to estimate, for the at least two states, a kilowatt-hour energy usage value of the one branch circuit that is decoupled from the main line during each of the at least two states.

22. The system of claim 12, comprising:
the controller configured to identify a first cycle that includes a plurality of states of the electrical distribution panel, wherein each state comprises one branch circuit of the plurality of branch circuits that is decoupled from the main line and one coupled branch circuit of the plurality of branch circuits that is coupled with the main line; and
the power sensor configured to measure the total power usage of the main line of each of the plurality of states of the first cycle;
the controller configured to estimate, for a first state of the first cycle, a kilowatt-hour energy usage value of the one branch circuit that is decoupled from the main line during the first state; and
the controller configured to average the kilowatt-hour energy usage value of the one branch circuit that is decoupled from the main line during the first state with a kilowatt-hour energy usage value of the one branch circuit corresponding to a state of a second cycle of a plurality of second states.

23. A branch circuit load estimation system, comprising:
an electrical distribution panel having a plurality of branch circuits;
a power sensor configured to measure total power usage of a main line of the electrical distribution panel during operation with at least two of the plurality of branch circuits coupled to the main line;
the power sensor further configured to measure a first power usage of the main line with a first of the two branch circuits decoupled from the main line;
a controller configured to determine a first time period that the first branch circuit is coupled with the main line; and
means for estimating a kilowatt-hour energy usage value of the first branch circuit based on the first time period and a differential between the measured total power usage and the measured first power usage.

\* \* \* \* \*